United States Patent
Kagaya et al.

(10) Patent No.: US 10,121,680 B2
(45) Date of Patent: Nov. 6, 2018

(54) SUBSTRATE PROCESSING APPARATUS

(71) Applicant: TOKYO ELECTRON LIMITED, Tokyo (JP)

(72) Inventors: Munehito Kagaya, Nirasaki (JP); Ayuta Suzuki, Nirasaki (JP); Kosuke Yamamoto, Nirasaki (JP); Tsuyoshi Moriya, Nirasaki (JP); Kazuyoshi Matsuzaki, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/831,811

(22) Filed: Dec. 5, 2017

(65) Prior Publication Data

US 2018/0166298 A1 Jun. 14, 2018

(30) Foreign Application Priority Data

Dec. 9, 2016 (JP) ................................ 2016-239541

(51) Int. Cl.
*H01L 21/67* (2006.01)
*C23C 16/455* (2006.01)

(52) U.S. Cl.
CPC .. *H01L 21/67017* (2013.01); *C23C 16/45508* (2013.01); *C23C 16/45565* (2013.01); *C23C 16/45525* (2013.01)

(58) Field of Classification Search
CPC ................................................ H01L 21/67017
See application file for complete search history.

(56) References Cited

U.S. PATENT DOCUMENTS

| | | | | |
|---|---|---|---|---|
| 9,984,906 B2* | 5/2018 | Matsumoto | ....... | H01J 37/32917 |
| 2006/0021580 A1* | 2/2006 | Hirano | ............. | H01J 37/32082 118/722 |
| 2008/0078746 A1* | 4/2008 | Masuda | ............. | H01J 37/3244 216/79 |
| 2009/0218045 A1* | 9/2009 | Hiroshima | ........ | H01J 37/32082 156/345.48 |
| 2009/0218317 A1 | 9/2009 | Belen et al. | | |
| 2010/0096088 A1* | 4/2010 | Okita | .................... | H01J 37/321 156/345.48 |
| 2012/0160416 A1* | 6/2012 | Tahara | ............. | H01J 37/32935 156/345.26 |

* cited by examiner

*Primary Examiner* — Errol Fernandes
(74) *Attorney, Agent, or Firm* — Nath, Goldberg & Meyer; Jerald L. Meyer

(57) ABSTRACT

In a substrate processing apparatus, a mounting table and a gas supply part are provided in a processing container to face each other. The processing gas introduced from introduction ports formed in the gas supply part on the opposite side of the gas supply part from the mounting table is supplied to the substrate from gas supply holes formed in an end portion of the gas supply part on the side of the mounting table. The gas supply part includes a central region and one or more outer peripheral regions surrounding the central region. The gas supply holes and the introduction ports are provided for each of the central region and the outer peripheral regions. The processing gas whose gas supply conditions are adjusted for each of the regions is continuously and outwardly supplied in a circumferential direction around the center axis from the introduction ports.

5 Claims, 10 Drawing Sheets

SUBSTRATE PROCESSING APPARATUS

CROSS-REFERENCE TO RELATED APPLICATION

This application is based upon and claims the benefit of priority from Japanese Patent Application No. 2016-239541, filed on Dec. 9, 2016, the entire contents of which are incorporated herein by reference.

TECHNICAL FIELD

The present disclosure relates to a substrate processing apparatus that performs a process such as a film forming process or the like on a substrate such as a semiconductor wafer or the like.

BACKGROUND

In a manufacturing process of a semiconductor device, a process such as a film forming process or the like is performed on a substrate such as a semiconductor wafer or the like. As a film forming method, for example, an ALD (Atomic Layer Deposition) method is available. In a film forming apparatus that forms a film using the ALD method, atomic layers are deposited one by one to form a desired film on a substrate, by repeating a cycle of supplying a precursor into a reaction chamber and purging the interior of the reaction chamber while heating a film formation target substrate. In the film forming apparatus, a mounting table on which a substrate is mounted and a gas supply part for supplying a processing gas to the substrate mounted on the mounting table are opposed to each other in a processing container. The processing gas is supplied from the gas supply part in a shower-like manner.

The above-described gas supply part, which is called a gas shower head or the like, includes a processing gas introduction port and gas supply holes formed in the lowermost portion thereof. In addition, the gas shower head includes a diffusion space provided between the introduction port and the gas supply holes and configured to diffuse a gas in the horizontal direction.

In the gas shower head, the diffusion space is divided into three. The diffusion spaces adjacent to each other are separated by partition walls. Gas supply holes are provided for each diffusion space. The gas shower head can control the supply amount of the processing gas to the substrate by individually adjusting the supply amount of the processing gas to be supplied to each diffusion space. Thus, the gas shower head can form a film with a uniform thickness. Furthermore, in the gas shower head, the central diffusion space is formed in a disc shape in a plan view, the outermost diffusion space is formed in an annular shape in a plan view, and the intermediate diffusion space positioned between the central diffusion space and the outermost diffusion space is also formed in an annular shape in a plan view. In addition, in the gas shower head, as shown in FIG. 10A, a plurality of processing gas introduction ports P having a circular shape in a plan view are formed at the positions overlapping, in a plan view, with the diffusion space S having an annular shape in a plan view.

However, when the introduction ports P are formed at the positions overlapping, in a plan view, with the diffusion space S having an annular shape in a plan view, a region R in which the concentration of the processing gas becomes thin is generated in a part of the outer peripheral portion of the diffusion space S. In other words, the concentration of the processing gas in the diffusion space S becomes non-uniform in the circumferential direction. By reducing the thickness of the diffusion space S in the vertical direction, it is possible to reduce the area of the region R as shown in FIG. 10B. However, it is difficult to eliminate the region R. If the region R in which the concentration of the processing gas becomes thin is present in a part of the outer peripheral portion of the diffusion space S as described above, the concentration of the processing gas in the space on the substrate just below the region R becomes thinner than in other portions. Furthermore, if the introduction ports P are formed at the positions overlapping, in a plan view, with the diffusion space S having an annular shape in a plan view, the concentration of the processing gas in the space on the substrate just below the introduction ports P becomes higher than other portions.

Therefore, if the introduction ports P are formed at the positions overlapping, in a plan view, with the diffusion space S having an annular shape in a plan view as in the above-described gas shower head, it is difficult to uniformly form a film having a desired film thickness. Furthermore, when the above-described gas shower head is used in a processing apparatus for etching a substrate, it is difficult to uniformly perform etching with a desired thickness for the same reason as described above.

SUMMARY

Some embodiments of the present disclosure provide a technique capable of processing a substrate with enhanced in-plane uniformity.

According to one embodiment of the present disclosure, there is provided a substrate processing apparatus in which a mounting table configured to mount a substrate and a gas supply part configured to supply a processing gas for processing the substrate are provided in a processing container so as to face each other, and the processing gas introduced from introduction ports formed in an end portion of the gas supply part on the opposite side of the gas supply part from the mounting table is supplied to the substrate from gas supply holes formed in an end portion of the gas supply part on the side of the mounting table, wherein the gas supply part includes a central region facing a central portion of the substrate and one or more outer peripheral regions surrounding the central region and having an annular shape around a center axis of the gas supply part in a plan view, the gas supply holes and the introduction ports are provided for each of the central region and the outer peripheral regions, the introduction ports corresponding to the outer peripheral regions are formed in an annular shape around the center axis in a plan view, and the processing gas whose gas supply conditions are adjusted for each of the regions is continuously and outwardly supplied in a circumferential direction around the center axis from the introduction ports corresponding to the outer peripheral regions to the gas supply holes corresponding to the outer peripheral regions.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
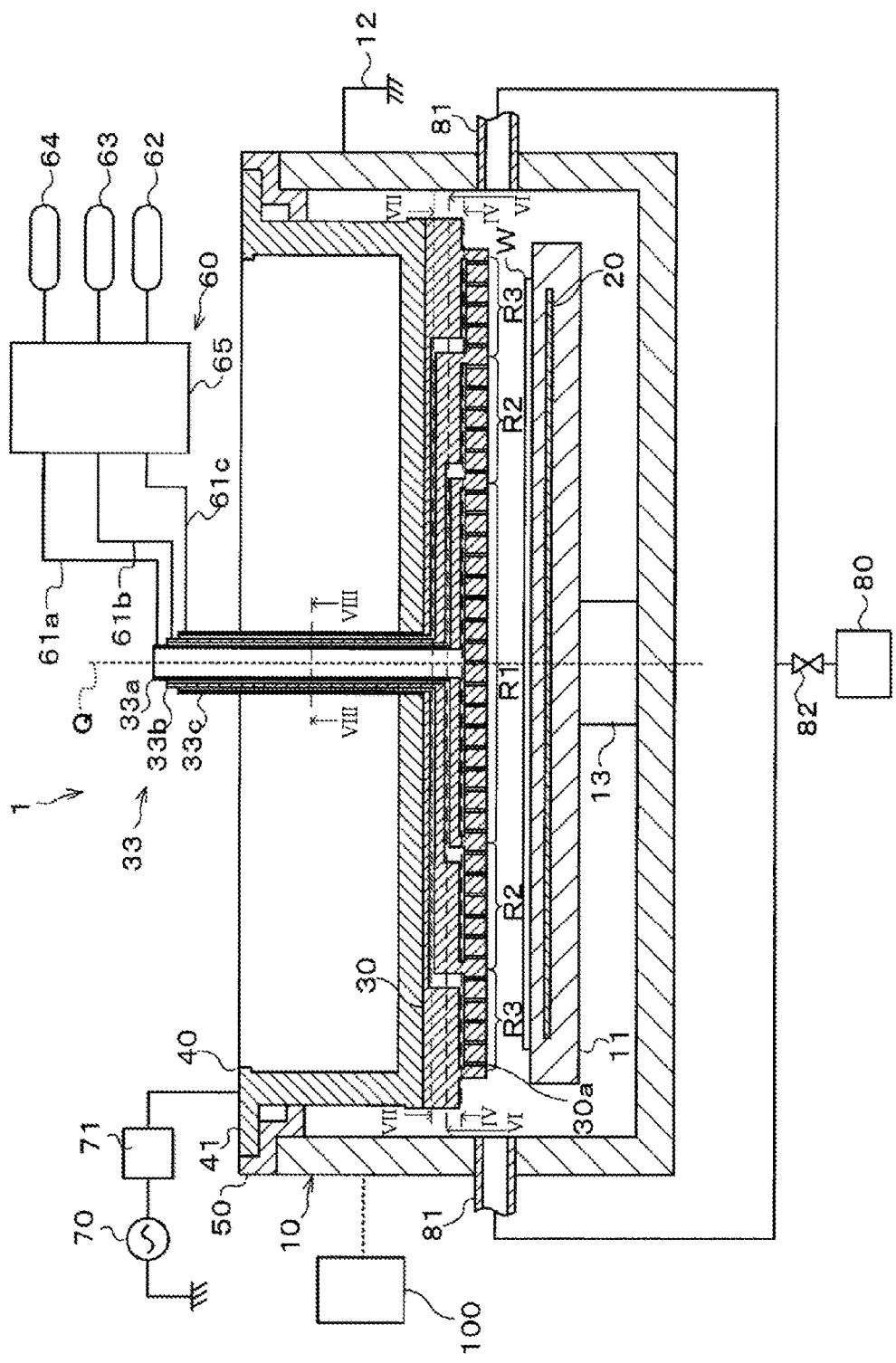
FIG. 1 is a vertical sectional view schematically showing a film forming apparatus as a substrate processing apparatus according to an embodiment of the present disclosure.

Hereinafter, embodiments of the present disclosure will be described with reference to the drawings. In the present specification and the drawings, the same reference numerals are given to the constituent elements having substantially the same function and configuration, and redundant explanations are omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a vertical sectional view schematically showing a film forming apparatus as a substrate processing apparatus according to an embodiment of the present disclosure. In the film forming apparatus 1 shown in FIG. 1, an $SiO_2$ film is formed on a semiconductor wafer W (hereinafter referred to as a wafer W) as a substrate by an ALD method. More specifically, an $SiO_2$ film is formed on a wafer W by a plasma-enhanced ALD (PEALD) method.

The film forming apparatus 1 includes a substantially cylindrical processing container 10 having a bottom and an open top, and a mounting table 11 provided in the processing container 10 and configured to mount a wafer W thereon. The processing container 10 is grounded by electrical connection via a ground line 12. Furthermore, the inner wall of the processing container 10 is covered with a liner (not shown) having, on its surface, a thermally sprayed film made of a plasma-resistant material.

The mounting table 11 is formed of, for example, a metallic material such as nickel or the like. The lower surface of the mounting table 11 is supported by a support member 13 made of a conductive material and is electrically connected thereto. The support member 13 is electrically connected to the bottom surface of the processing container 10. Therefore, the mounting table 11 is grounded via the processing container 10. The mounting table 11 functions as a lower electrode that forms a pair with a below-described gas supply part 30 which functions as an upper electrode. The configuration of the lower electrode is not limited to the content of the present embodiment and may be, for example, a configuration in which a conductive member such as a metal mesh or the like is embedded in the mounting table 11. Furthermore, the lower portion of the support member 13 extends downward through an insertion hole (not shown) formed in the central portion of the bottom portion of the processing container 10. The support member 13 is vertically movable by an elevating mechanism (not shown), whereby the mounting table 11 is raised and lowered.

The mounting table 11 incorporates an electric heater 20 that can heat the wafer W mounted on the mounting table 11 to a predetermined temperature.

In addition, a plurality of support pins (not shown) is provided under the mounting table 11 and inside the processing container 10. Insertion holes (not shown) through which the support pins are inserted are formed in the mounting table 11. Therefore, when the mounting table 11 is lowered, the wafer W is received by the upper end portions of the support pins penetrating the insertion holes of the mounting table 11, whereby the wafer W can be delivered between the support pins and the transfer arm (not shown) that enters the processing container 10 from the outside. Above the mounting table 11 and inside the processing container 10, a gas supply part 30 is provided in parallel with the mounting table 11 so as to face the mounting table 11. In other words, the gas supply part 30 is disposed to face the wafer W mounted on the mounting table 11. The gas supply part 30 is made of a conductive metal such as, for example, nickel (Ni) or the like.

The gas supply part 30 is configured to supply a processing gas for processing the wafer W to the wafer W. The gas supply part 30 also functions as an upper electrode. Details of the gas supply part 30 will be described later.

A substantially cylindrical lid 40 having a bottom and an open top is connected to the upper end surface of the gas supply part 30. Similar to the gas supply part 30, the lid 40 is also made of a conductive metal such as nickel or the like. The lid 40 and the gas supply part 30 may be formed integrally.

An engaging portion 41 protruding outward of the lid 40 is formed on the outer peripheral portion of the upper surface of the lid 40. The lower surface of the engaging portion 41 is held by an annular support member 50 supported by the upper end portion of the processing container 10. The support member 50 is made of an insulating material such as, for example, quartz or the like. Therefore, the lid 40 and the processing container 10, namely the gas supply part 30 and the processing container 10 are electrically insulated from each other. An electric heater (not shown) is provided on the upper surface of the lid 40. The lid 40 and the gas supply part 30 connected to the lid 40 can be heated to a predetermined temperature by the electric heater.

The gas supply part 30 is provided with a connecting pipe 33 penetrating the lid 40. A processing gas supply source 60 is connected to the connecting pipe 33 via gas supply pipes 61a to 61c existing outside the film forming apparatus 1. The processing gas supplied from the processing gas supply source 60 is supplied into the gas supply part 30 via the gas supply pipes 61a to 61c and the connecting pipe 33. The processing gas supplied to the gas supply part 30 is introduced into the processing container 10 in a shower-like manner through gas supply holes 31a to be described later.

The processing gas supply source 60 includes a raw material gas supply part 62 for supplying a BDEAS (bisdiethylaminosilane) gas as a raw material gas for forming a $SiO_2$ film, a reaction gas supply part 63 for supplying an $O_2$ (oxygen) gas as a reaction gas reacting with the raw material gas, and an inert gas supply part 64 for supplying an Ar (argon) gas as an inert gas. Furthermore, the processing gas supply source 60 includes a gas supply condition adjusting part 65 composed of a valve, a mass flow controller and the like. The gas supply condition adjusting part 65 adjusts the gas supply conditions of the processing gas such as a gas type, a gas mixing ratio, a flow rate and the like. The processing gas supply source 60 is connected to three introduction ports 32a to 32c (to be described later) of the gas supply part 30 via the connecting pipe 33. The processing gas whose gas supply conditions are adjusted for each of the introduction ports 32a to 32c by the gas supply condition adjusting part 65 can be supplied to each of the introduction ports 32a to 32c.

A high frequency power source 70 for supplying high frequency power to the gas supply part 30 functioning as an upper electrode through the lid 40 to generate plasma is electrically connected to the lid 40 via a matcher 71. The high frequency power source 70 is configured to be capable of outputting high frequency power having a frequency of 100 kHz to 100 MHz, for example. The matcher 71 matches the internal impedance of the high frequency power source 70 with the load impedance. The matcher 71 acts so that, when plasma is generated in the processing container 10, the internal impedance of the high frequency power source 70 apparently coincides with the load impedance.

An exhaust pipe 81 is connected to the side surface of the processing container 10. An exhaust mechanism 80 for evacuating the interior of the processing container 10 is connected to the exhaust pipe 81. The exhaust pipe 81 is provided with a regulating valve 82 for regulating the exhaust amount by the exhaust mechanism 80. Therefore, by driving the exhaust mechanism 80, it is possible to exhaust the atmosphere in the processing container 10 via the exhaust pipe 81 and to depressurize the interior of the processing container 10 to a predetermined degree of vacuum.

The film forming apparatus 1 described above is provided with a control part 100. The control part 100 is, for example, a computer, and includes a program storage part (not shown). In the program storage part, there is stored a program for operating the film forming apparatus 1 by controlling the respective devices such as the electric heater 20, the gas supply condition adjusting part 65, the high frequency power source 70, the matcher 71, the exhaust mechanism 80, the regulating valve 82 and the like.

The program is recorded in a computer-readable storage medium such as, for example, a computer-readable hard disk (HD), a flexible disk (FD), a compact disk (CD), a magneto-optical disk (MO), a memory card or the like and may be installed in the control part 100 from the storage medium.

Next, a process of forming a $SiO_2$ film on the wafer W in the film forming apparatus 1 will be described. In the film forming process, first, the wafer W is loaded into the processing container 10 and is mounted and held on the mounting table 11. The loading of the wafer W into the processing container 10 is performed in a vacuum state using a load lock chamber or the like. When the wafer W is held on the mounting table 11, the gas supply part 30 and the wafer W on the mounting table 11 are heated to and maintained at, for example, 100 degrees C. or higher by the electric heater 20 or the like. Alternatively, the wafer W may be heated to and maintained at 50 to 100 degrees C.

At the same time, an $O_2$ gas and an Ar gas are supplied from the processing gas supply source 60 into the processing container 10 at predetermined flow rates, respectively. At this time, the gas supply condition adjusting part 65 is controlled so that the flow rate of the $O_2$ gas is approximately 100 to 10000 sccm and the flow rate of the Ar gas is approximately 100 to 5000 sccm. Furthermore, the opening degree of the regulating valve 82 and the like are controlled so that the pressure inside the processing container 10 is, for example, 50 Pa to 1300 Pa.

At the stage when the temperature of the wafer W, the pressure inside the processing container 10, and the like, are stabilized, in addition to the $O_2$ gas and the like, a BDEAS gas is supplied from the processing gas supply source 60 into the processing container 10 for a predetermined period at a predetermined flow rate. The gas supply condition adjusting part 65 is controlled so that the flow rate of the BDEAS gas is approximately 5 to 200 sccm. As a result, the BDEAS gas is adsorbed to the wafer W.

After the BDEAS gas adsorption step, the supply of the BDEAS gas is stopped, and the interior of the processing container 10 is purged. Next, by applying high frequency power to the gas supply part 30 with the high frequency power source 70, the Ar gas and the $O_2$ gas supplied into the processing container 10 are converted into plasma. Then, the $O_2$ gas activated by the plasma is supplied to the wafer W. As a result, the BDEAS adsorbed to the wafer W is oxidized to form $SiO_2$.

Thereafter, the application of the high frequency power is stopped, and the interior of the processing container 10 is purged. Then, the adsorption step and the oxidation step of the BDEAS gas are repeated to obtain a $SiO_2$ film having a desired film thickness. The BDEAS gas adsorption step is performed for about 0.05 to 1 second, and the step of supplying the activated $O_2$ gas to oxidize the BDEAS gas is performed for about 0.2 to 0.5 seconds.

When the processing of the wafer W is completed, the wafer W is unloaded from the processing container 10. Then, a new wafer W is loaded into the processing container 10, and the series of processing of the wafer W is repeatedly performed.

Figure 2:
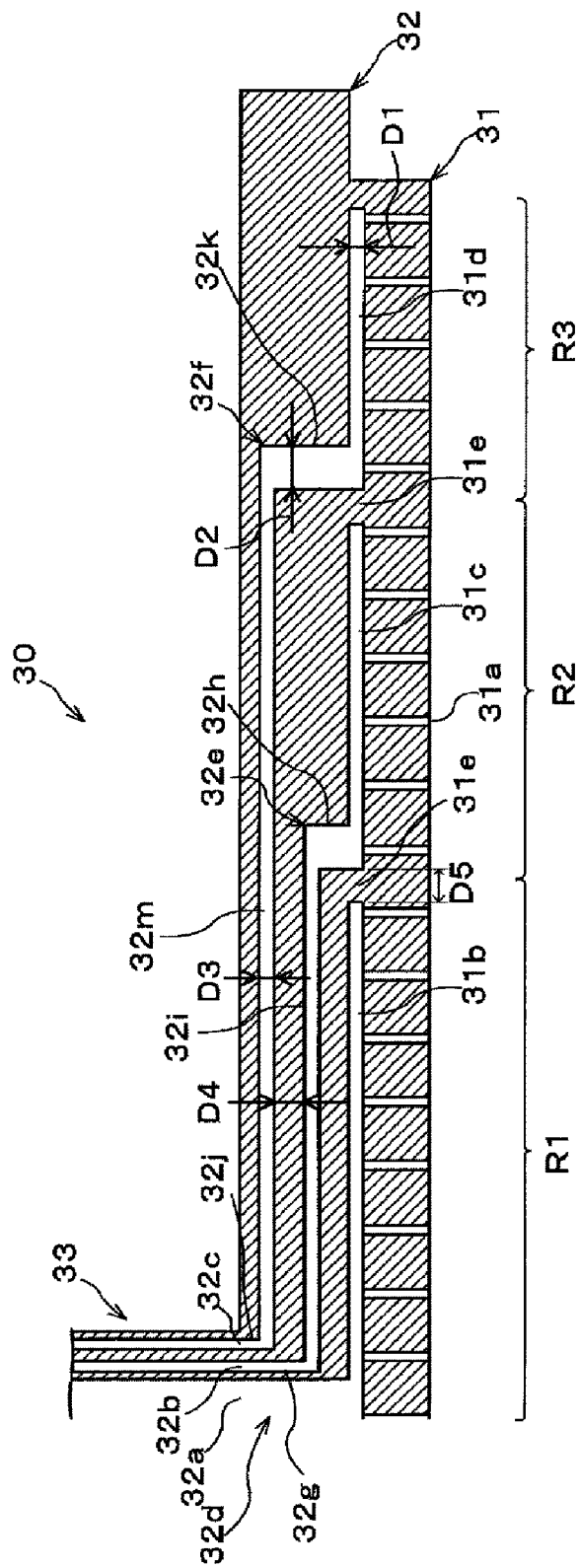
FIG. 2 is a partially enlarged view of the film forming apparatus shown in FIG. 1.

Subsequently, the gas supply part 30 of the film forming apparatus 1 will be described with reference to FIG. 1 and FIGS. 2 to 4. FIG. 2 is a partially enlarged view of the film forming apparatus shown in FIG. 1, FIG. 3 is a schematic view showing the lower surface of a below-described shower head 31 of the gas supply part 30, and FIG. 4 is a sectional view taken along line IV-IV in FIG. 1.

As shown in FIG. 2, the gas supply part 30 includes a shower head 31 provided at the end on the side of the mounting table 11, and an upper structure 32 provided on the opposite side of the shower head 31 from the mounting table 11, namely on the upper side of the shower head 31. The connecting pipe 33 is connected to the opposite side of the upper structure 32 from the shower head 31.

The shower head 31 has gas supply holes 31a for supplying the processing gas to the wafer W, at the position corresponding to the end portion of the gas supply part 30 on the side of the mounting table 11.

Figure 3:
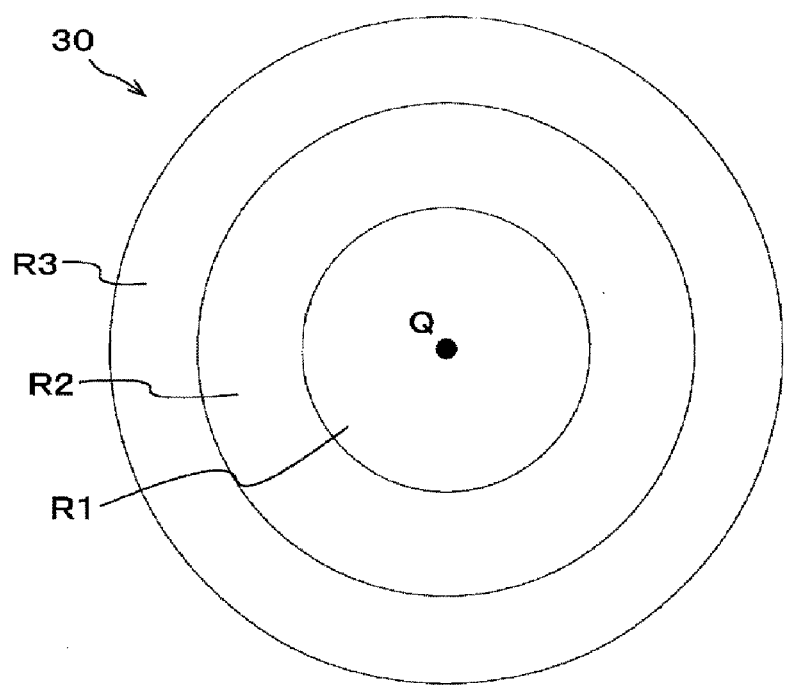
FIG. 3 is a schematic view showing a lower surface of a shower head of a gas supply part shown in FIG. 1.
Figure 4:
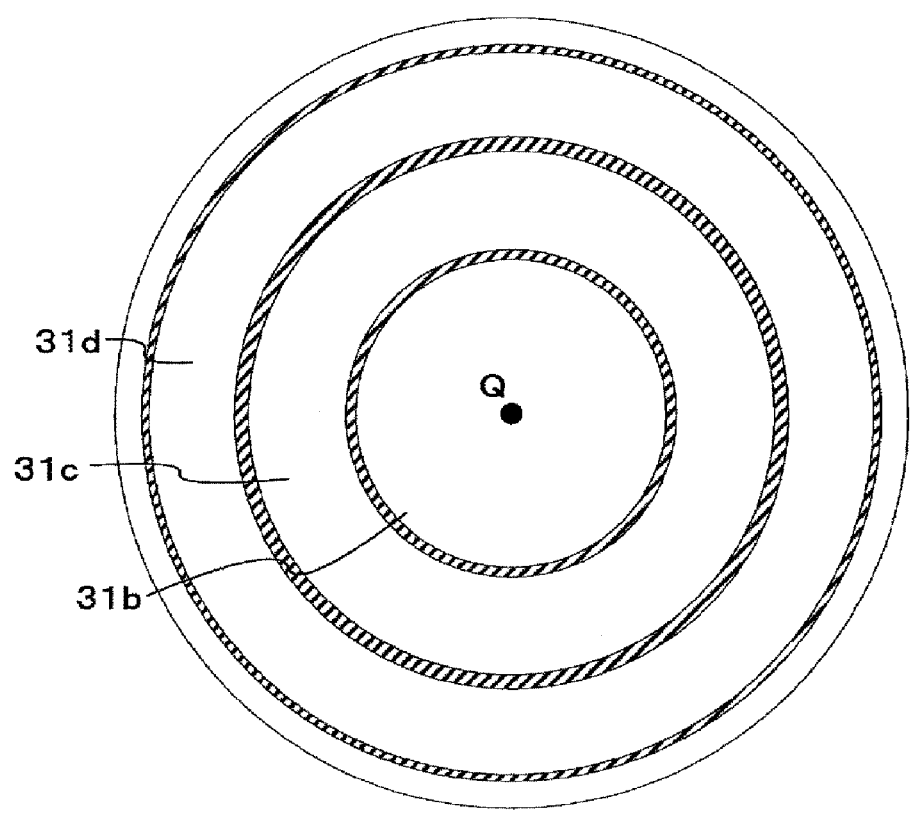
FIG. 4 is a sectional view taken along line IV-IV in FIG. 1.

As shown in FIGS. 1 and 3, the gas supply part 30 is provided with a central region R1, a first outer peripheral region R2 and a second outer peripheral region R3. The central region R1 is a region facing the central portion of the mounting table 11, i.e., the wafer W. The first outer peripheral region R2 is a region that surrounds the outer side of the central region R1. Further, the first outer peripheral region R2 is an annular region around a center axis Q as viewed from the direction of the center axis Q of the gas supply part 30, namely in a plan view. The second outer peripheral region R3 is a region that surrounds the outer side of the central region R1 and the first outer peripheral region R2 and is an annular region around the center axis Q in a plan view.

The gas supply holes 31a of the shower head 31 is provided in a plural number in each of the regions R1 to R3. The shower head 31 has diffusion spaces 31b to 31d for diffusing a gas in a direction perpendicular to the center axis Q, i.e., in a horizontal direction. The central diffusion space 31b communicates with the gas supply holes 31a in the central region R1. As shown in FIG. 4, a central diffusion space 31b is formed in a circular shape around the center axis Q in a plan view. A first outer peripheral diffusion space 31c communicates with the gas supply holes 31a in the first outer peripheral region R2. The first outer peripheral diffusion space 31c is positioned on the outer side of the central diffusion space 31b and is formed in an annular shape around the center axis Q in a plan view. A second outer peripheral diffusion space 31d communicates with the gas supply holes 31a in the second outer peripheral region R3. The second outer peripheral diffusion space 31d is positioned on the outer side of the first outer peripheral diffusion space 31c and is formed in an annular shape around the center axis Q in a plan view.

As shown in FIGS. 1 and 2, the upper structure 32 of the gas supply part 30 has introduction ports 32a to 32c at the position corresponding to the opposite end of the gas supply part 30 from the mounting table 11. The introduction ports 32a to 32c are provided one by one for each of the above-mentioned regions R1 to R3.

A central introduction port 32a supplies the processing gas to the gas supply holes 31a in the central region R1. More specifically, the central introduction port 32a supplies the processing gas to the central diffusion space 31b via a central supply path 32d. A first outer introduction port 32b supplies the processing gas to the gas supply holes 31a in the first outer peripheral region R2. More specifically, the first outer introduction port 32b supplies the processing gas to the first outer peripheral diffusion space 31c via a first outer peripheral supply path 32e. A second outer introduction port 32c supplies the processing gas to the gas supply holes 31a in the second outer peripheral region R3. More specifically, the second outer introduction port 32c supplies the processing gas to the second outer peripheral diffusion space 31d via a second outer peripheral supply path 32f.

Processing gases having different gas supply conditions are supplied to the central introduction port 32a, the first outer introduction port 32b and the second outer introduction port 32c via the connecting pipe 33. The central supply path 32d, the first outer peripheral supply path 32e and the second outer peripheral supply path 32f are independent from each other. The central diffusion space 31b, the first outer peripheral diffusion space 31c and the second outer peripheral diffusion space 31d of the shower head 31 are separated from each other by partition walls 31e. Therefore, the gas supply part 30 can supply the processing gases whose gas supply conditions have been adjusted for each of the regions, via the gas supply holes 31a.

Figure 5:
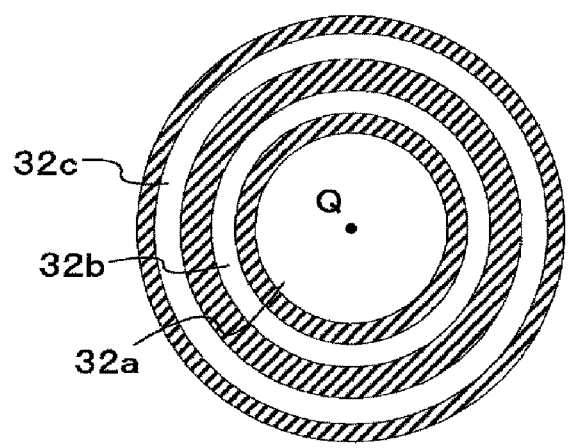
FIG. 5 is a horizontal sectional view of the vicinity of introduction ports in a gas supply part shown in FIG. 1.

The manner of supplying the processing gases from the introduction ports 32a to 32c to the diffusion spaces 31b to 31d will be described with reference to FIGS. 1 and 2 and FIG. 5. FIG. 5 is a horizontal sectional view of the vicinity of the introduction ports 32a to 32c in the gas supply part 30.

As is apparent from FIGS. 1 and 2, all the introduction ports 32a to 32c are located above the central portion of the wafer W. As shown in FIG. 5, the central introduction port 32a is formed in a circular shape around the center axis Q in a plan view. The first outer introduction port 32b is positioned on the outer side of the central introduction port 32a and is formed in an annular shape around the center axis Q in a plan view. The second outer introduction port 32c is positioned on the outer side of the first outer introduction port 32b and is formed in an annular shape around the center axis Q in a plan view.

As shown in FIG. 2, the processing gas from the circular central introduction port 32a is supplied to the circular central diffusion space 31b from the center of the circular central diffusion space 31b via the central supply path 32d. In addition, the processing gas from the annular first outer introduction port 32b is radially discharged via the first outer peripheral supply path 32e and is supplied to the annular first outer peripheral diffusion space 31c. More specifically, the processing gas from the annular first outer introduction port 32b is continuously and outwardly discharged in the circumferential direction around the center axis Q via the first outer peripheral supply path 32e and is supplied to the annular first outer peripheral diffusion space 31c. In the present specification, the expression "(the gas is) continuously discharged in the circumferential direction" means that "(the gas is) discharged spatially continuously in the circumferential direction." Furthermore, the processing gas from the annular second outer introduction port 32c is radially discharged via the second outer peripheral supply path 32f and is supplied to the annular second outer peripheral diffusion space 31d. More specifically, the processing gas from the annular second outer introduction port 32c is continuously and outwardly discharged in the circumferential direction around the center axis Q via the second outer peripheral supply path 32f and is supplied to the annular second outer peripheral diffusion space 31d.

Therefore, in the central diffusion space 31b, the first outer peripheral diffusion space 31c and the second outer peripheral diffusion space 31d of the gas supply part 30, the concentration of the processing gas is uniform in the circumferential direction around the center axis Q. Therefore, the concentration of the processing gas supplied from the gas supply holes 31a of the gas supply part 30 becomes uniform in the circumferential direction around the center axis Q. It is therefore possible to uniformly process the wafer W in the plane thereof.

In the above configuration, depending on the supply rate of the processing gas, there may be a case where in each of the central diffusion space 31b, the first outer peripheral diffusion space 31c and the second outer peripheral diffusion space 31d, the concentration of the processing gas is not uniform in the radial direction around the center axis Q and is lowered toward the outer peripheral portion. Even in this case, the processing gas supplied to the wafer W flows toward the outer peripheral portion of the wafer W by the suction of the exhaust mechanism 80. Thus, the in-plane uniformity of the wafer W is not affected.

Figure 6:
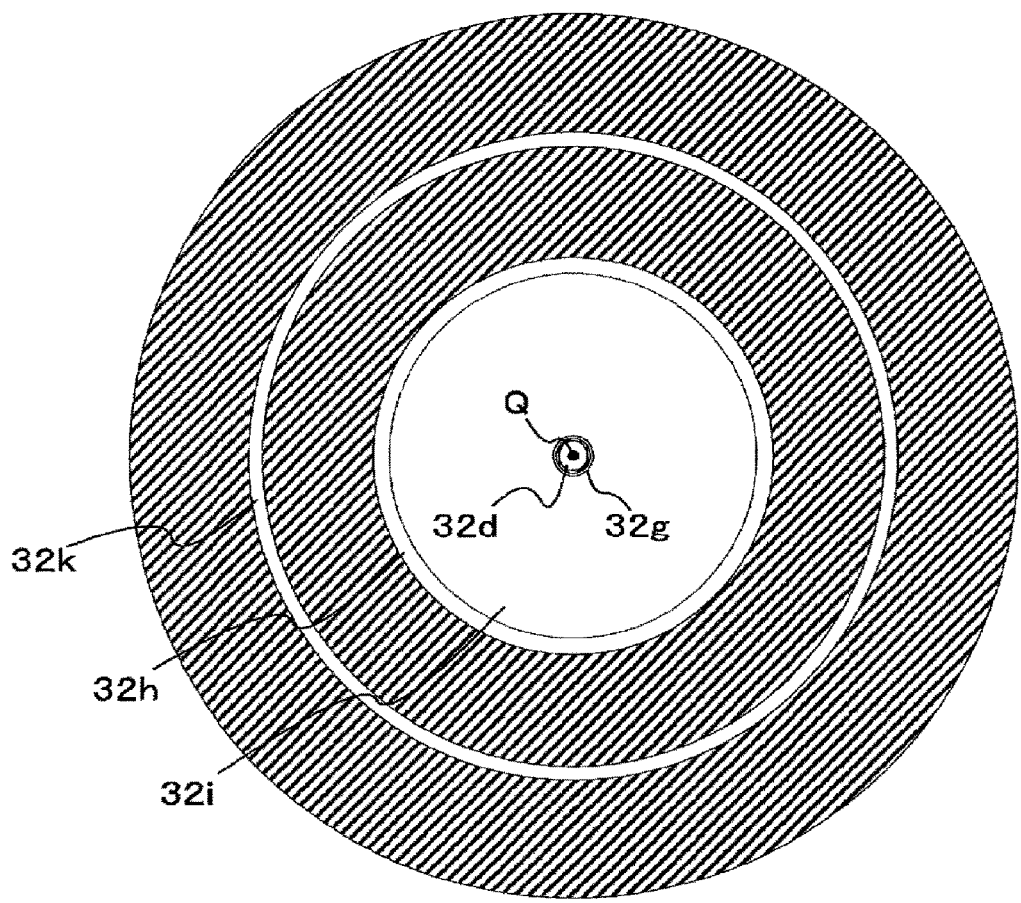
FIG. 6 is a sectional view taken along line VI-VI in FIG. 1.

The central supply path 32d, the first outer peripheral supply path 32e and the second outer peripheral supply path 32f will be described with reference to FIG. 2 and FIGS. 6 and 7. FIG. 6 is a sectional view taken along a line VI-VI in FIG. 1, and FIG. 7 is a sectional view taken along line VII-VII in FIG. 1.

Figure 7:
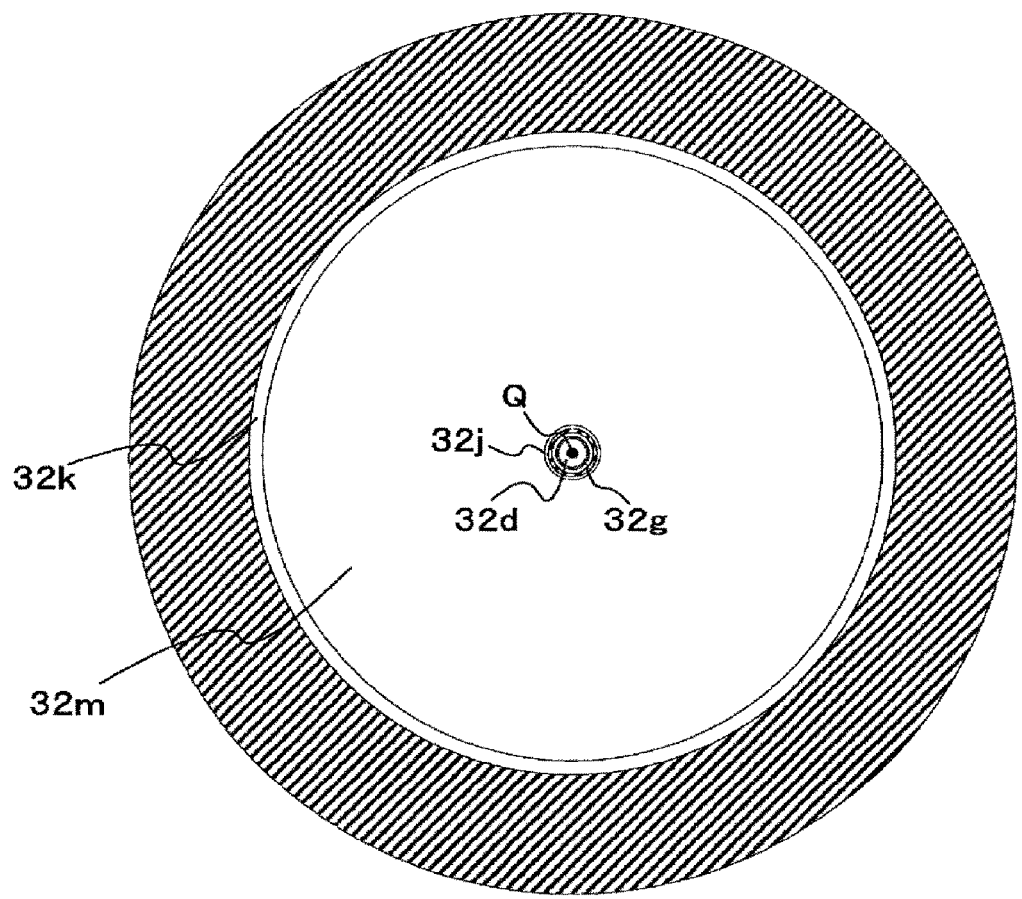
FIG. 7 is a sectional view taken along line VII-VII in FIG. 1.

As shown in FIGS. 6 and 7, the central supply path 32d is formed in a cylindrical shape around the center axis Q.

Furthermore, the first outer peripheral supply path 32e includes vertical supply paths 32g and 32h having a cylindrical space around the center axis Q, and a horizontal supply path 32i having an annular plate-shaped space around the center axis Q. The upper end of the vertical supply path 32g is connected to the first outer introduction port 32b and the lower end of the vertical supply path 32g is connected to the inner end of the horizontal supply path 32i. The upper end of the vertical supply path 32h is connected to the outer end of the horizontal supply path 32i and the lower end of the vertical supply path 32h is connected to the inner end of the first outer peripheral diffusion space 31c.

The second outer peripheral supply path 32f includes vertical supply paths 32j and 32k having a cylindrical space around the center axis Q, and a horizontal supply path 32m having an annular plate-shaped space around the center axis Q. The upper end of the vertical supply path 32j is connected to the second outer introduction port 32c and the lower end of the vertical supply path 32j is connected to the inner end of the horizontal supply path 32m. The upper end of the vertical supply path 32k is connected to the outer end of the horizontal supply path 32m and the lower end of the vertical supply path 32k is connected to the inner end of the second outer peripheral diffusion space 31d.

Hereinafter, the dimensions of main portions of the gas supply part 30 will be described. It is assumed that the wafer W processed by the film forming apparatus 1 has a diameter of 300 mm. Furthermore, the respective dimensions are preferred when the pressure inside the processing container 10 is 200 to 400 Pa and when the Ar gas flow rate, the $O_2$ gas flow rate and the BDEAS gas flow rate with respect to the respective ports 32a to 32c are 1500 to 2500 sccm, 400 to 600 sccm and 25 to 30 sccm, respectively.

The thickness D1 of the second outer peripheral diffusion space 31d is preferably as small as possible in order to uniformly process the wafer W in the plane thereof. However, if the thickness D1 is too small, it is not possible to uniformly process the wafer W. Specifically, the thickness D1 of the second outer peripheral diffusion space 31d is preferably 2 to 7 mm. This also applies to the thicknesses of the first outer peripheral diffusion space 31c and the central diffusion space 31b.

The width D2 of the vertical supply path 32k of the second outer peripheral supply path 32f is preferably smaller than a predetermined thickness, for example, 6 mm or less, in order to uniformly process the wafer W in the plane thereof. The same applies to the width of the vertical supply path 32h of the first outer peripheral supply path 32e.

The thickness D3 of the horizontal supply path 32m of the second outer peripheral supply path 32f is preferably as small as possible in order to uniformly process the wafer W in the plane thereof, for example. Preferably, the thickness D3 is 1.5 mm to 5 mm. The same applies to the horizontal supply path 32i of the first outer peripheral supply path 32e.

The thickness D4 of the partition wall between the horizontal supply path 32i of the first outer peripheral supply path 32e and the horizontal supply path 32m of the second outer peripheral supply path 32f is preferably as small as possible in order to reduce the thickness of the gas supply part 30 as a device.

The thickness D5 of the partition wall 31e between the central diffusion space 31b and the first outer peripheral diffusion space 31c is preferably as small as possible in order to uniformly process the wafer W in the plane thereof. The same applies to the thickness of the partition wall 31e between the first outer peripheral diffusion space 31c and the second outer peripheral diffusion space 31d.

Figure 8:
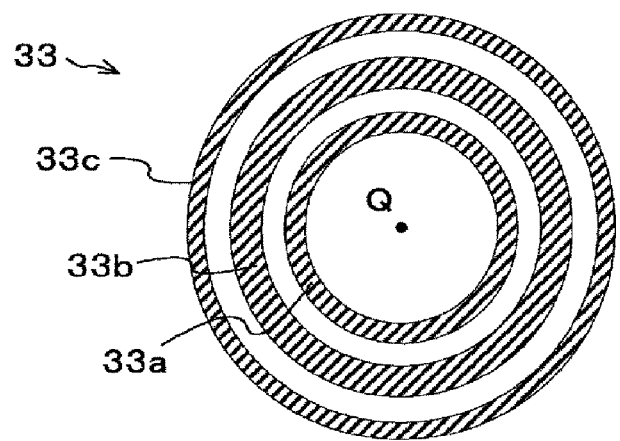
FIG. 8 is a sectional view taken along line VIII-VIII in FIG. 1.
Figure 9:
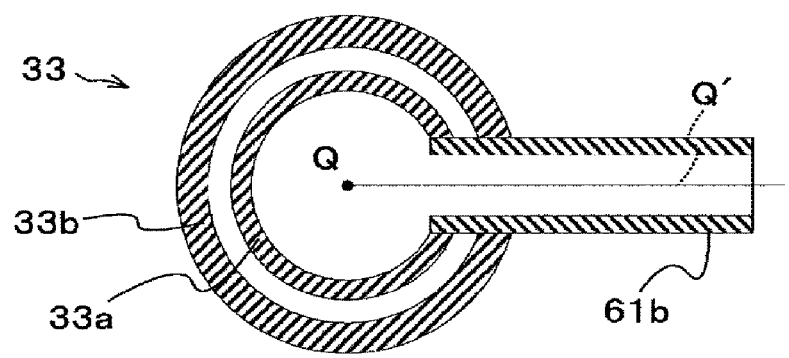
FIG. 9 is a partially enlarged sectional view of a connecting portion of a connecting pipe shown in FIG. 1 and an external gas supply pipe.
Figure 10A:
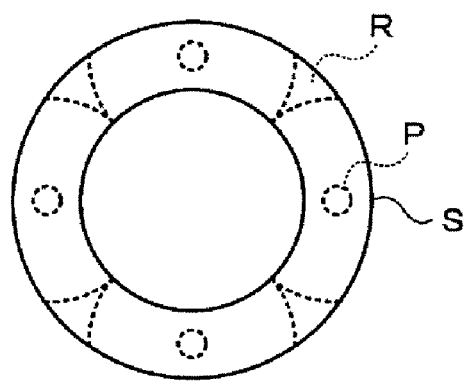
FIGS. 10A and 10B are views for explaining a problem of the related art.
Figure 10B:
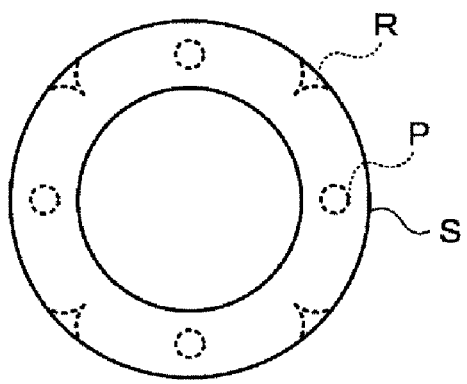

Subsequently, the connecting pipe 33 will be described with reference to FIG. 2 and FIGS. 8 and 9. FIG. 8 is a sectional view taken along line VIII-VIII in FIG. 1, and FIG. 9 is a partially enlarged sectional view of a connecting portion between the connecting pipe 33 and the external gas supply pipe 61b. As shown in FIG. 8, the connecting pipe 33 is formed by concentrically arranging three cylindrical pipes 33a to 33c having different diameters around the center axis Q. Each of the pipes 33a to 33c is preferably longer than a predetermined length. By making the length longer than the predetermined length, it is possible to make the concentration of the processing gas uniform not only in the central diffusion space 31b but also in the first and second outer peripheral diffusion spaces 31c and 31d with good repeatability in the circumferential direction.

In the central pipe 33a, the gas supply space inside thereof communicates with the central introduction port 32a. Furthermore, the gas supply space formed by the central pipe 33a and the pipe 33b outside the central pipe 33a, namely the gas supply space formed by the outer wall of the inner pipe 33a and the inner wall of the outer pipe 33b in the adjacent pipes 33a and 33b, communicates with the first outer introduction port 32b. The gas supply space formed by the pipe 33b and the pipe 33c outside the pipe 33b, namely the gas supply space formed by the outer wall of the inner pipe 33b and the inner wall of the outer pipe 33c in the adjacent pipe 33b and 33c, communicates with the second outer introduction port 32c.

As shown in FIG. 9, an external gas supply pipe 61b extending in the direction perpendicular to the center axis Q is connected to the pipe 33b in the outer portion of the connecting pipe 33 so that the center axis Q of the pipe 33b and the center axis Q' of the external gas supply pipe 61b coincide with each other. The connection of an external gas supply pipe 61c to the pipe 33c also holds true. By this connection, the concentration of the processing gas in the outer peripheral diffusion spaces 31c and 31d can be made uniform in the circumferential direction.

Since the connection of the external gas supply pipe 61a to the central pipe 33a of the connecting pipe 33 is similar to the conventional one, the description thereof will be omitted.

In the above example, the first outer peripheral supply path 32e or the second outer peripheral supply path 32f is formed in a step-like shape formed of a vertical supply path and a horizontal supply path. However, a part or the whole thereof may be formed in a slope shape not extending in the vertical direction or the horizontal direction. Furthermore, in the first outer peripheral supply path 32e or the second peripheral supply path 32f, the connecting portion between the vertical supply path and the horizontal supply path is formed so as to be at a right angle in a cross-sectional view. However, the connecting portion may be formed to describe an arc in a cross-sectional view.

The above embodiment can be applied not only to film formation by a PEALD method but also to film formation by a thermal ALD method, and can also be applied to film formation by a CVD (Chemical Vapor Deposition) method. Furthermore, the above embodiment can be applied not only to the formation of a $SiO_2$ film but also to other types of film formation. In addition, the above embodiment is applicable to processes other than the film forming process, such as an etching process and the like.

The present disclosure can be applied to a substrate processing apparatus that performs a process such as a film forming process or the like on a substrate surface.

According to the present disclosure in some embodiments, it is possible to process a substrate with enhanced in-plane uniformity.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus in which a mounting table configured to mount a substrate and a gas supply part configured to supply a processing gas for processing the substrate are provided in a processing container so as to face each other, and the processing gas introduced from introduction ports formed in an end portion of the gas supply part on the opposite side of the gas supply part from the mounting table is supplied to the substrate from gas supply holes formed in an end portion of the gas supply part on the side of the mounting table,
   - wherein the gas supply part includes a central region facing a central portion of the substrate and one or more outer peripheral regions surrounding the central region and having an annular shape around a center axis of the gas supply part in a plan view,
   - the gas supply holes and the introduction ports are provided for each of the central region and the outer peripheral regions,
   - the introduction ports corresponding to the outer peripheral regions are formed in an annular shape around the center axis in a plan view, and
   - the processing gas whose gas supply conditions are adjusted for each of the regions is continuously and outwardly supplied in a circumferential direction around the center axis from the introduction ports corresponding to the outer peripheral regions to the gas supply holes corresponding to the outer peripheral regions.

2. The apparatus of claim 1, wherein the gas supply part includes gas supply paths configured to supply the processing gas from the introduction ports corresponding to the outer peripheral regions to the gas supply holes corresponding to the outer peripheral regions, and
   - the gas supply paths are formed in an annular shape around the center axis in a plan view.

3. The apparatus of claim 2, wherein the gas supply paths include a supply path formed in an annular cylinder shape around the center axis and a supply path formed in an annular plate shape around the center axis.

4. The apparatus of claim 1, wherein the gas supply part includes diffusion spaces provided in the central region and the outer peripheral regions, the diffusion spaces configured to diffuse a gas in a direction perpendicular to the center axis and communicating with the gas supply holes corresponding to the central region and the outer peripheral regions, and
   - the diffusion spaces corresponding to the outer peripheral regions are formed in an annular shape around the center axis in a plan view.

5. The apparatus of claim 1, wherein the gas supply part includes a connecting pipe configured to connect the introduction ports corresponding to the central region and the outer peripheral regions and an external gas supply pipe,
   - the connecting pipe is formed by concentrically arranging a plurality of pipes having different diameters around the center axis, and
   - the gas introduction ports corresponding to the outer peripheral regions communicate with a gas supply space formed by an outer wall of an inner one of two adjacent pipes and an inner wall of an outer one of the two adjacent pipes.

* * * * *